United States Patent [19]

Omura et al.

[11] Patent Number: 5,188,973
[45] Date of Patent: Feb. 23, 1993

[54] METHOD OF MANUFACTURING SOI SEMICONDUCTOR ELEMENT

[75] Inventors: Yasuhisa Omura; Yasuo Kunii; Katsutoshi Izumi, all of Kanagawa, Japan

[73] Assignee: Nippon Telegraph & Telephone Corporation, Japan

[21] Appl. No.: 877,446

[22] Filed: Apr. 30, 1992

[30] Foreign Application Priority Data

May 9, 1991 [JP] Japan .................... 3-132227

[51] Int. Cl.$^5$ .......................................... H01L 21/70
[52] U.S. Cl. ........................................ 437/40; 437/21; 437/41; 437/61; 437/89; 437/203; 257/347
[58] Field of Search ............... 437/21, 40, 41, 61, 437/89, 90, 203; 357/23.7; 148/DIG. 152

[56] References Cited

U.S. PATENT DOCUMENTS

| | | | |
|---|---|---|---|
| 4,277,883 | 7/1981 | Kaplan | 437/203 |
| 4,685,196 | 8/1987 | Lee | 437/203 |
| 5,120,666 | 6/1992 | Gobou | 437/203 |

FOREIGN PATENT DOCUMENTS 2-162740 6/1990 Japan .

OTHER PUBLICATIONS

Y. Omura et al., "0.1-μm-Gate, Ultrathin-Film CMOS Devices Using SIMOX Substrate with 80-nm-Thick Buried Oxide Layer", CH3075-9/91/0000-0675$1.00 ©1991 IEEE, pp. 675-678.
J. P. Colinge et al., "Silicon-On-Insulator Gate-All-Around Device", CH2865-4/90/0000-0595 $1.00 ©1990 IEEE, pp. 595-598.
Tetsu Tanaka et al., "Analysis of P+ Poly Si Double-Gate Thin-Film SOI MOSFETS", CH3075-9/91/00-00-0683 $1.00 ©1991 IEEE, pp. 683-686.

Primary Examiner—Tom Thomas
Attorney, Agent, or Firm—Blakely, Sokoloff, Taylor & Zafman

[57] ABSTRACT

According to a method of manufacturing an SOI semiconductor element of this invention, a structure obtained by forming a first semiconductor layer on a first insulator is prepared. A process mask is arranged on the first semiconductor layer. The process mask has a groove pattern of a predetermined size. A groove extending between the first semiconductor layer and the first insulator layer is formed by etching the first semiconductor layer on the basis of the groove pattern of the process mask to expose the first insulator layer and etching the first insulator layer to a predetermined depth. A second semiconductor layer serving as a buried electrode is formed in the groove such that a level of an upper surface of the second semiconductor layer is equal to a level of a bottom surface of the first semiconductor layer. A second insulator layer is formed on the second semiconductor layer. Crystalline growth of a semiconductor layer is performed from side surfaces of the groove to bury the groove with a monocrystalline semiconductor. A source region and a drain region are formed in the monocrystalline semiconductor buried in the groove. A gate electrode is formed on the monocrystalline semiconductor through a gate oxide film.

10 Claims, 9 Drawing Sheets

METHOD OF MANUFACTURING SOI SEMICONDUCTOR ELEMENT

BACKGROUND OF THE INVENTION

The present invention relates to a method of manufacturing an SOI (Silicon On Insulator) semiconductor element for obtaining a high-speed operation and, more particularly, to a method of manufacturing an SOI MOS field-effect semiconductor element.

A conventional SOI semiconductor element is shown in FIG. 2. FIG. 2 is a longitudinal sectional view of an SOI MOS field-effect semiconductor element. Reference numeral 1 denotes a silicon substrate; 2, an $SiO_2$ buried oxide film for electrically insulating a silicon active layer 3 of a first conductivity type (e.g., p-type) from the silicon substrate 1; and 4, an $SiO_2$ gate oxide film serving as a gate insulator. Reference numeral 5 denotes a source region of a second conductivity type (e.g., n-type); 6, a drain region of the second conductivity type (e.g., n-type); 7, a gate electrode; 8, an insulator for electrically insulating interconnections from each other; 9, a source electrode; and 10, a drain electrode.

An SOI semiconductor element of this type is arranged as follows. That is, the impurity concentration of the active layer 3 is controlled such that a depletion layer which can extend from the gate electrode 7 has a thickness larger than a thickness $t_1$ of the active layer 3, and the entire region of the active layer 3 is depleted in an ON state of the SOI semiconductor element to realize the following effects:

(1) Suppression of mobility deterioration of carriers at an inverted surface immediately under the gate insulator is achieved by a decrease in effective electric field strength in the active layer, and a drain current is increased by this suppression.

(2) A drain current is increased by an increase in carriers at the inverted surface in correspondence with a decrease in charge amount of the depletion layer in the active layer.

In an SOI semiconductor element with the above arrangement, since the active layer 3 is depleted by a gate-induced electric field, a drain-induced electric field applied from a drain junction to the active layer can be suppressed, and a short-channel effect of a threshold voltage can be suppressed. In addition, when a thickness $t_3$ of the buried oxide film 2 immediately under the drain region 6 is increased, a parasitic capacitance can be decreased. Therefore, in the SOI semiconductor element of this type, the high-density integration and high-speed operation of the SOI semiconductor element are expected by down-scaling. In recent years, the SOI semiconductor element has received a great deal of attention for future applications.

However, when a thickness $t_2$ of the buried oxide film 2 immediately under the active layer 3 is increased, it is apparent that the following drawback is posed. That is, the drain-induced electric field adversely affects an electric field distribution in the active layer 3 through the buried oxide film 2, thereby enhancing a short-channel effect.

In order to solve the drawback, when a thickness $t_4$ of an oxide film 2 immediately under an active layer 3 is smaller than that in FIG. 2, as shown in FIG. 3, a thickness $t_5$ of a buried oxide film in a drain region 6 is decreased. In this case, although the short-channel effect can be suppressed, a parasitic capacitance is increased due to a decrease in the thickness $t_5$ of the buried oxide film 2 immediately under the drain region 6, thereby failing to achieve the high-speed operation of the SOI semiconductor element.

In contrast to this, an SOI semiconductor element shown in FIG. 4 is proposed to solve the above problems of the SOI semiconductor element shown in FIGS. 2 and 3. The same reference numerals as in FIG. 2 denote the same parts or parts having the same functions in FIG. 4. In FIG. 4, according to the characteristic features of the SOI semiconductor element, a buried electrode 7A is formed in a buried oxide film 2 for electrically insulating a p-type active layer 3 from a semiconductor substrate 1, and the buried electrode 7A is arranged immediately under the active layer 3 at a depth corresponding to a thickness $t_6$.

With the above arrangement, a thickness $t_7$ of the buried oxide film 2 immediately under a drain region 6 can be increased, and the thickness $t_6$ of the buried oxide film 2 immediately under the active layer 3 can be decreased. Therefore, a decrease in parasitic capacitance of the drain region 6 and suppression of a short-channel effect can be realized, and the high-speed operation and down-scaling of the SOI semiconductor element can be achieved at the same time.

FIGS. 5A to 5E are views showing the steps of a method of manufacturing the conventional SOI semiconductor element shown in FIG. 4. This was reported at the International Electron Devices Meeting held by the IEEE (Institute of Electrical and Electronics Engineers) in 1990 (J. P. Colinge, M. H. Gao, A. Romano-Rodriguez, and C. Claes, "Silicon-On-Insulator Gate-All-Around Device". pp. 595–598).

As shown in FIG. 5A, a silicon oxide film 12A is buried in, e.g., a silicon semiconductor substrate to obtain a silicon semiconductor substrate S having a silicon substrate 11 and a first silicon semiconductor layer 11A.

As shown in FIG. 5B, the first silicon semiconductor layer 11A is processed by an anisotropic plasma etching technique or the like to have predetermined dimensions so as to form a silicon semiconductor layer 11a.

As shown in FIG. 5C, a photoresist is coated on the major surface of the semiconductor substrate, and the photoresist is exposed and developed to expose an oxide film 3a located at the underlying portion of the opposite end portions of the semiconductor layer 11a. Thereafter, an exposed oxide film 12 is etched by, e.g., hydrofluoric acid, and side etching caused by the etching removes the buried oxide film immediately under the silicon semiconductor layer 11a, thereby forming a hollow groove 12c under the semiconductor layer 11a. Note that reference numeral 13a in FIG. 5C denotes a buried oxide film after this groove is formed.

As shown in FIG. 5D, the major surface of the silicon substrate is exposed to an oxygenous ambiance to oxidize the surface of the silicon semiconductor layer 11a, thereby forming oxide films 13a, 13b, 13c and 13d. Thereafter, a silicon semiconductor layer 7X used as a gate electrode is deposited on the major surface of the silicon semiconductor substrate 11 by a technique such as a CVD method (Chemical Vapor Deposition method). At this time, by using the CVD method, a silicon semiconductor layer 7A can also be buried in the groove 12c.

Finally, as shown in FIG. 5E, the silicon semiconductor layer 7X on the semiconductor substrate is processed to have predetermined dimensions so as to form a gate electrode 7. Subsequently, n-type source and drain regions 5 and 6 are formed by, e.g., an ion-implantation technique or the like. Thereafter, when electrodes are formed, the SOI semiconductor element shown in FIG. 4 can be obtained. Note that reference numeral 3 in FIG. 5E denote a p-type active layer between the source region 5 and the drain region 6.

In the above manufacturing method, however, not only a removal width h of the buried oxide film 12 cannot be directly controlled as shown in FIG. 5C, but the dimensions of the oxide film 12 cannot be easily reproduced. On the other hand, as shown in FIG. 5E, the gate electrode in the buried oxide film 12, i.e., the buried electrode 7A, overlaps the source region 5 and the drain region 6 by lengths 1D and 1S, respectively. It is known that the parasitic capacitance of the SOI semiconductor element is increased in proportion to the lengths 1D and 1S to fail to achieve the high-speed operation of the SOI semiconductor element. In the above manufacturing method, the increase in parasitic capacitance of the overlap portion becomes a decisive drawback as the gate length is decreased.

In the above manufacturing method, since a part of the buried oxide film is removed to form a hollow portion, the thickness of the oxide film 13d is equal to that of the gate oxide film 13c. Therefore, a parasitic capacitance between the gate electrode 7 and the semiconductor substrate 11 is considerably increased, thereby failing to achieve the high-speed operation of the SOI semiconductor element.

As described above, although an SOI semiconductor element of this type has several advantageous characteristics, at the same time, it has the above problems. Therefore, the SOI semiconductor element is not practically used.

FIGS. 6A to 6H are views showing the steps of another method of manufacturing the semiconductor element using the buried electrode shown in FIG. 4. This example is disclosed in Japanese Patent Laid-Open No. 2-162740. In this example, a silicon oxide film 112 is formed on a silicon semiconductor substrate 111, and a polysilicon film 117 and a silicon oxide film 118 are sequentially formed in this order.

As shown in FIGS. 6B to 6F, the silicon oxide film 118, the polysilicon film 117, a silicon oxide film 16, a monocrystalline silicon film 115, a silicon oxide film 114, and a polysilicon film 113 are sequentially etched to expose the silicon oxide film 112. During this etching step, a floating gate electrode 117' is formed. Reference numeral 120 denotes a silicon nitride film; 119, a silicon oxide film; and 113', a backgate electrode.

Thereafter, as shown in FIG. 6G, silicon is epitaxially grown from the side surfaces of a channel portion 115', to form films 122a and 122b used as the source and drain regions. Note that reference numeral 123 denotes an oxide film; 124, a BSG or BPSG film; and 125a and 125b, aluminum interconnections.

However, in this manufacturing method, the following problems are posed.

First, since the silicon film 113' used as the second gate electrode is close to the films 122a and 122b used as the source and drain regions through a thin insulator 121 in a wide area, a gate-source parasitic capacitance and a gate-drain parasitic capacitance are considerably increased. According to this method, a gate capacitance is almost equal to these parasitic capacitances, thereby failing to achieve the high-speed operation of the semiconductor element.

Second, in this method, since the active region 115, is crystallized into a monocrystalline region such that amorphous silicon is melted by the radiation of a laser beam, the carrier mobility in this region is decreased to about ⅓ that of the monocrystalline silicon, a high-speed operation cannot be realized.

Third, in recent years, as the scale of an integrated circuit is increased, a multi-layered interconnection for connecting semiconductor devices to each other is demanded. At this time, in order to form the interconnection with a high yield, an underlying layer must be flattened. Therefore, recess and projecting portions of the underlying layer must be decreased before the interconnection step is started. In this condition, the structure described above goes against the current trend in semiconductor fabrication techniques, and it is understood that the structure cannot be easily applied to an integrated circuit in the future.

SUMMARY OF THE INVENTION

It is, therefore, a principal object of the present invention to provide a method of manufacturing an SOI semiconductor element capable of solving a conventional problem of failure in a high-speed operation and realizing a high-speed operation of a large-scale integrated circuit.

It is another object of the present invention to provide a method of manufacturing an SOI semiconductor element capable of suppressing a short-channel effect and suppressing an increase in parasitic capacitance and interconnection capacitance.

It is still another object of the present invention to provide a method of manufacturing an SOI semiconductor element suitable for an integrated circuit.

In order to achieve the above objects, according to an aspect of the present invention, there is provided a method of manufacturing an SOI semiconductor element, comprising the steps of preparing a structure obtained by forming a first semiconductor layer on a first insulator, arranging a process mask on the first semiconductor layer, the process mask having a groove pattern of a predetermined size, forming a groove extending between the first semiconductor layer and the first insulator layer by etching the first semiconductor layer on the basis of the groove pattern of the process mask to expose the first insulator layer and etching the first insulator layer to a predetermined depth, forming a second semiconductor layer serving as a buried electrode in the groove such that a level of an upper surface of the second semiconductor layer is equal to a level of a bottom surface of the first semiconductor layer, forming a second insulator layer on the second semiconductor layer, performing crystalline growth of a semiconductor layer from side surfaces of the groove to bury the groove with a monocrystalline semiconductor, forming a source region and a drain region in the monocrystalline semiconductor buried in the groove, and forming a gate electrode on the monocrystalline semiconductor through a gate oxide film.

DESCRIPTION OF THE PREFERRED EMBODIMENT

Figure 1A:
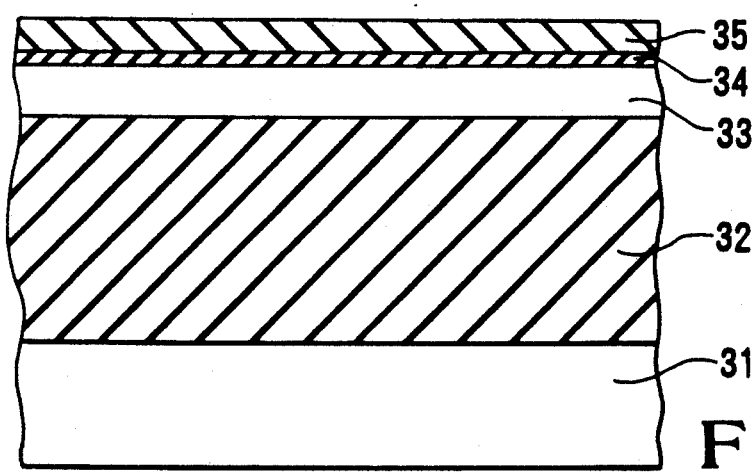
FIGS. 1A to 1L are sectional views showing the steps of a method of manufacturing an SOI semiconductor element according to an embodiment of the present invention.

FIGS. 1A to 1L show a method of manufacturing an SOI semiconductor element according to an embodiment of the present invention. In these drawings, in the manufacturing method of the present invention, as shown in FIG. 1A, a semiconductor substrate is formed as follows. That is, a first insulator layer, e.g., a silicon oxide film 32 having a thickness of 100 nm, is buried in a silicon semiconductor, a first silicon semiconductor layer 33 having a thickness of 50 nm is formed on the oxide film 32, and a silicon semiconductor layer 31 serving as a base is formed under the first insulator layer 32.

This semiconductor substrate is formed in the following manner. Oxygen ions are implanted in a silicon substrate at an acceleration energy of 180 keV and a dose of $4 \times 10^{17}$ cm$^{-2}$, and the resultant structure is annealed in, e.g., an Ar (argon)+O$_2$ (oxygen) ambiance at 1,350° C. for 4 hours. In this step, a semiconductor substrate in which the silicon oxide film having a thickness of about 100 nm is formed inside the semiconductor substrate and the silicon semiconductor layer having a thickness of about 270 nm is formed on the surface of the semiconductor substrate is obtained. Thereafter, the surface of the substrate is oxidized at a temperature of, e.g., 1,100° C. for 10 hours, and the oxide is removed by, e.g., hydrofluoric acid, such that the thickness of a surface silicon film can be adjusted to 50 nm.

Thereafter, a silicon oxide film 34 is formed on the major surface of the semiconductor substrate, and an anti-oxidized insulator 35 such as a silicon nitride film is deposited on the silicon oxide film 34. In this case, the silicon oxide film 34 is formed as an oxide film having a thickness of 12 nm and obtained by flowing oxygen at a temperature of 900° C. and a flow rate of 10 l/min for 30 minutes. In addition, the silicon nitride film 35 is formed as a nitride film having a thickness of 20 nm and obtained by flowing NH$_3$+SiH$_2$Cl$_2$ at a temperature of 850° C. for 8 minutes.

Figure 1B:
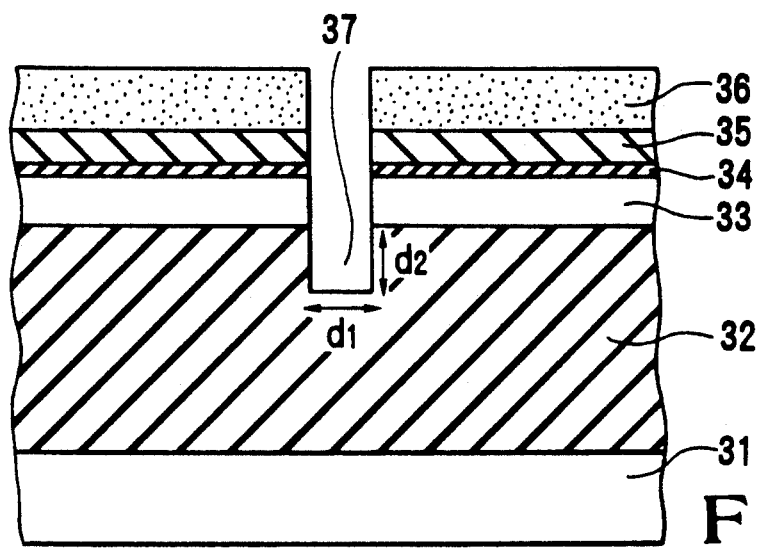

As shown in FIG. 1B, after a photoresist 36 is coated on the major surface of the semiconductor substrate to have a thickness of 1 μm, this photoresist 36 is exposed by an electron beam exposing method to form a groove pattern of the photoresist having a predetermined size $d_1$ ($d_1 = 0.1$ μm). Thereafter, the anti-oxidized insulator 35, the silicon oxide film 34, the silicon semiconductor layer 33 are etched by, e.g., an anisotropic plasma etching technique or the like, using the photoresist as a mask. A reactive ion etching technique (RIE) is used when a silicon nitride film is used as the anti-oxidized insulator 35. This etching is performed using CF$_4$+H$_2$ (a ratio of the flow rate of CF$_4$ to that of H$_2$=65:35) as a gas at room temperature, an RF power density=0.1 to 0.15 W/cm$^2$, and a pressure of 3 Pa (pascal) for one minute. In addition, the silicon oxide film 34 is etched using an aqueous HF solution as an etchant at room temperature and a concentration of 10% for one minute. The silicon layer 33 is etched by an ECR stream etching technique, and this etching is performed using Cl$_2$ gas at an RF power density=5 to 6 W/cm$^2$ and a pressure of 10 Pa for 3 minutes.

The buried oxide film 32 is etched to a predetermined depth $d_2$ to form a groove 37. At this time, as this etching, a reactive ion etching technique (RIE) is used, and this etching is performed using CF$_4$(=65:35) as a gas at room temperature, an RF power density=0.1 to 0.15 W/cm$^2$, and a pressure of 3 Pa (pascal) for 3 minutes. As a result, a groove having a depth $d_2 = 60$ nm is formed.

Figure 1C:
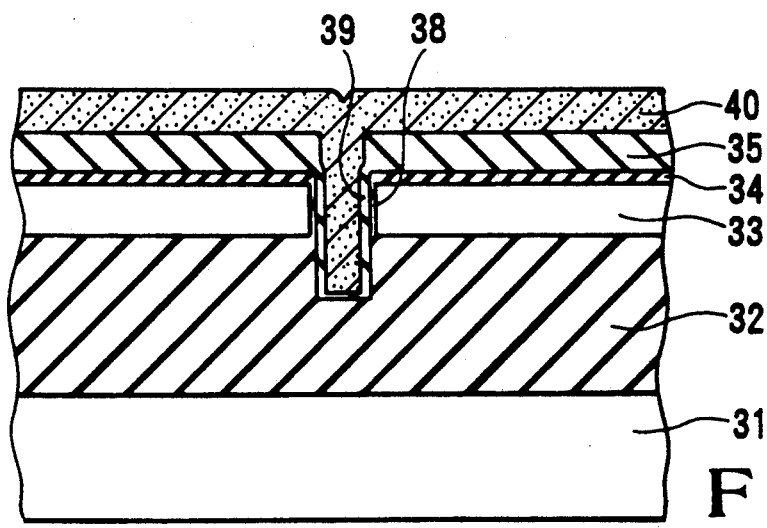

As shown in FIG. 1C, after the photoresist 36 is removed, the major surface of the semiconductor substrate is exposed to an oxygenous ambiance to form an oxide film 38 on the exposed surface of the silicon semiconductor layer 33. Subsequently, an insulator 39 such as a silicon nitride film is formed on the major surface of the semiconductor substrate, and a silicon semiconductor film 40 serving as the second semiconductor layer and having a thickness required for burying the groove 37 are deposited on the insulator 39. Note that the oxide film 38 is formed by flowing oxygen gas (O$_2$) at a temperature of 900° C. and a flow rate of 10 l/min for 30 minutes. When a silicon nitride film is used as the insulator 39, the silicon nitride film is formed using a low-pressure CVD method by flowing NH$_3$+SiH$_2$Cl$_2$ gas at a temperature of 850° C. for 4 minutes. The silicon semiconductor layer 40 having a thickness of 200 nm is formed using a low-pressure CVD method by flowing SiH$_4$+PH$_3$ gas at a temperature of 600° C. for 20 minutes.

Figure 1D:
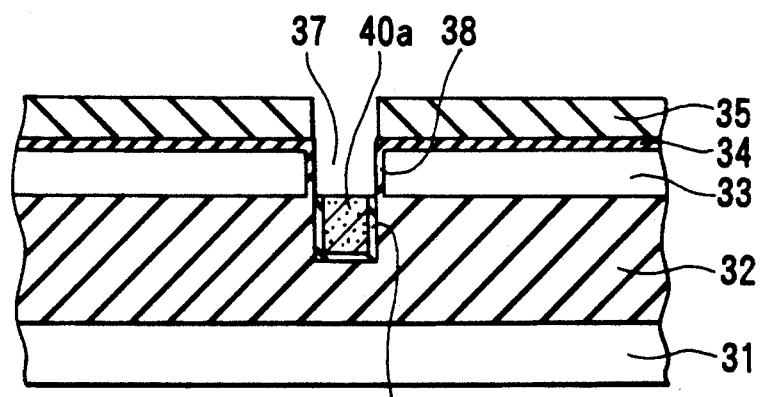

As shown in FIG. 1D, the deposited silicon semiconductor layer 40 is etched by, e.g., an anisotropic plasma etching technique or the like, to be left in only the groove 37. At this time, the level of the upper surface of a silicon semiconductor layer 40a left in the groove is adjusted to the level of the bottom surface of the semiconductor layer 33 as much as possible. Thereafter, the exposed silicon nitride film 39 is etched by the deposition thickness of the silicon nitride film 39 to expose the oxide film 38. In this case, when the silicon semiconductor layer 40 is etched, an ECR stream etching technique is used as an etching technique. This etching is performed by using Cl$_2$ gas at an RF power density=5 to 6 W/cm$^2$ and a pressure of 10 Pa for 10 minutes. In addition, when the silicon nitride film 39 is to be etched, this etching is performed such that the silicon nitride film 39 is dipped in phosphoric acid at a temperature of 160° C. in the 5 minutes.

Figure 1E:
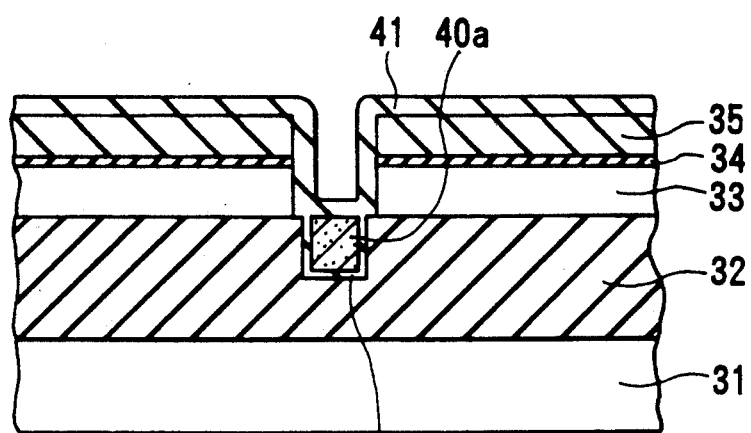

As shown in FIG. 1E, the oxide film 38 on the side of the semiconductor layer 33 in the groove 37 is removed to expose the side surface of the semiconductor layer 33, and an anti-oxidized insulator 41 such as a silicon nitride film is deposited on the major surface of the semiconductor substrate. At this time, the silicon oxide film is etched at room temperature in a concentration of 10% for 1 minute using an HF aqueous solution as an enchant. In addition, when a silicon nitride film is used as the insulator 41, a low-pressure CVD method is used. A nitride film having a thickness of 20 nm is formed by flowing NH$_3$+SiH2Cl$_2$ gas at a temperature of 850° C. for 8 minutes.

Figure 1F:
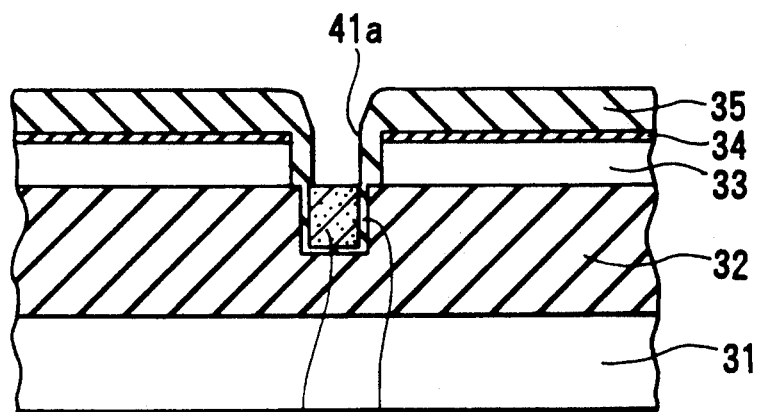

As shown in FIG. 1F, the silicon nitride film 41 on the major surface of the semiconductor substrate is etched by, e.g., an anisotropic plasma etching technique or the like to expose the upper surface of the silicon semiconductor layer 40 and to leave a silicon nitride film 41a on the side surfaces of the silicon semiconductor layer 33. At this time, the nitride film 41 is etched by a reactive ion etching technique (RIE) such that $CF_4 + H_2$ gas (a ratio of the flow rate of $CF_4$ to that of $H_2 = 65:35$) flows at room temperature, an RF power density=0.1 to 0.15 W/cm$^2$, and a pressure of 3 Pa (pascal) for 3 minutes.

Figure 1G:
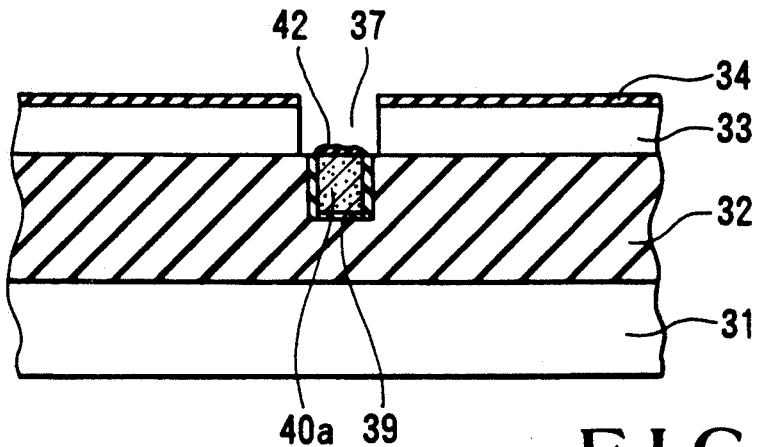

As shown in FIG. 1G, the major surface of the semiconductor substrate is exposed to an oxygenous ambiance to form a silicon oxide film 42 as the second insulator layer on the upper surface of the semiconductor layer 40a in the groove 37. Thereafter, the silicon nitride films 41a and 35 are removed to expose the silicon oxide film 34 and to expose the side surface of the silicon semiconductor layer 33 in the groove 37. When the oxide film 42 serving as the second insulator layer is to be formed, the following condition is used. That is, oxygen gas ($O_2$) flows at a temperature of 900° C. and a flow rate of 10 l/min for 30 minutes. When the silicon nitride film 41a is to be etched, this etching is performed such that the silicon nitride film 41 is dipped in phosphoric acid at a temperature of 160° C. for 5 minutes.

Figure 1H:
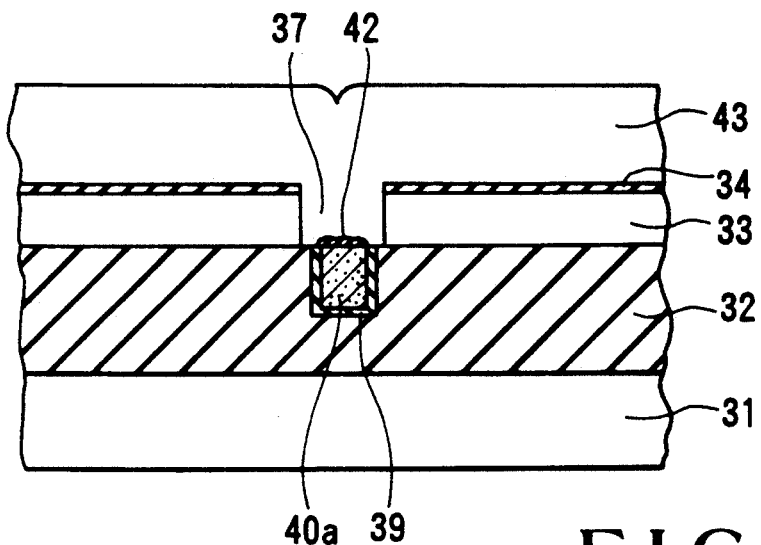

As shown in FIG. 1H, an amorphous silicon layer 43 having a thickness required for burying the groove 37 on the major surface of the semiconductor substrate is deposited on the resultant structure. At this time, when the amorphous silicon layer 43 is to be deposited using a solid-phase epitaxial growth method, the semiconductor substrate is exposed in a $SiH_4 + N_2$ gas ambiance at a temperature of 550° C. and a pressure of 100 Torr for 5 minutes to obtain the amorphous silicon layer 43 having a thickness of 200 nm. In addition, an epitaxial lateral over-growth method is used, the semiconductor substrate is exposed in an $SiH_2Cl_2 + H_2$ gas ambiance at a temperature of 950° C. and a pressure of 100 Torr for 5 minutes to obtain the amorphous silicon layer 43 having a thickness of 200 nm.

Figure 1I:
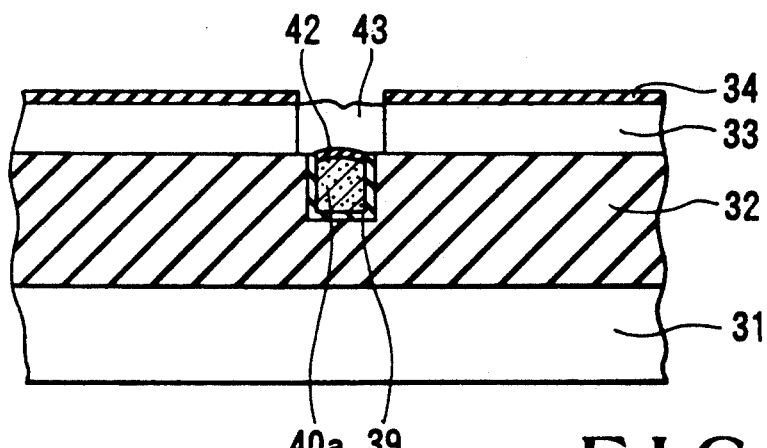

As shown in FIG. 1I, the amorphous silicon layer 43 on the major surface of the semiconductor substrate is etched by an anisotropic plasma etching technique or the like to be left in only the groove 37. At this time, the level of the upper surface of the amorphous silicon layer 43 in the groove 37 is set to be equal to the level of the upper surface of the semiconductor layer 33 as much as possible. At this time, the silicon layer is etched by an ECR stream etching technique, and this ECR stream etching technique is performed using $Cl_2$ gas at an RF power density=5 to 6 W/cm$^2$ and a pressure of 10 Pa for 3 minutes.

Figure 1J:
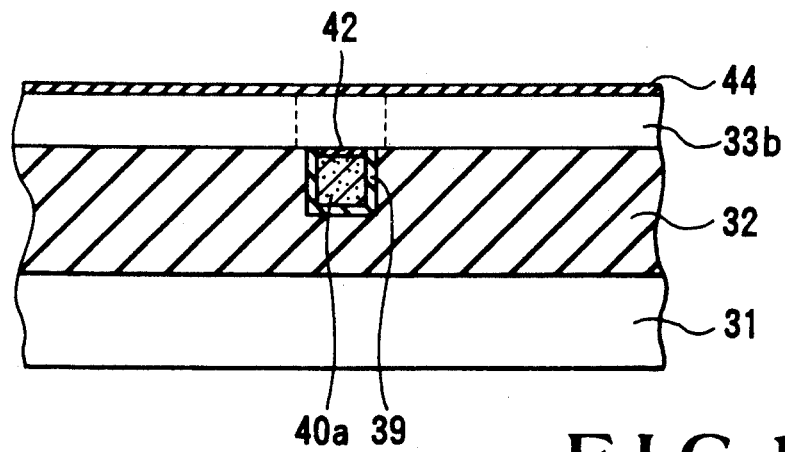

As shown in FIG. 1J, the resultant structure is annealed for a predetermined time at a temperature of 500° C. to 600° C. at which the solid-phase epitaxial growth of the amorphous silicon layer 43 is started from the side surface of the silicon layer 33, such that the amorphous silicon layer 43 is crystallized into a monocrystalline layer. At this time, the silicon semiconductor layer is represented by reference numeral 33b. After the silicon oxide film 34 is removed, an oxide film 44 is formed on the surface of the silicon semiconductor layer 33. At this time, in the steps of FIGS. 1H to 1J, a groove 37a of the silicon semiconductor layer 33b may be directly buried with a monocrystalline silicon layer by, e.g., an epitaxial lateral over-growth method (a selective lateral epitaxial growth method on the basis of a chemical vapor growth method) on the major surface of the semiconductor substrate. At this time, an aqueous HF solution is used as an enchant for the silicon oxide film 34, and the etching is performed at room temperature in a concentration of 10% for 1 minute. The oxide film 44 is formed such that oxygen gas ($O_2$) flows at a temperature of 900° C. and a flow rate of 10 l/min for 30 minutes.

Figure 1K:
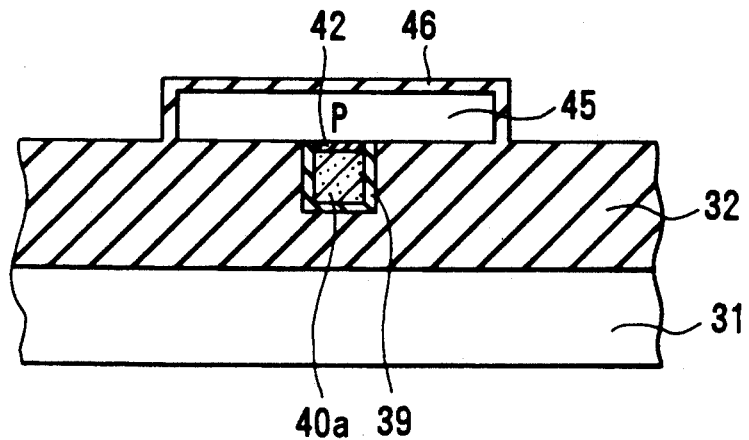

As shown in FIG. 1K, the silicon semiconductor layer 33b is processed to have predetermined dimensions so as to form an active layer 45. Thereafter, the active layer 45 is changed into a semiconductor layer of a first conductivity type, e.g., a p-type semiconductor layer, by an ion-implantation technique, and the surface of the active layer 45 is oxidized to form a gate oxide film 46. At this time, an ECR stream etching technique is used as an etching technique for changing the silicon layer 33b into the active layer 45, and this etching is performed using $Cl_2$ gas at an RF power density=5 to 6 W/cm$^2$ and a pressure of 10 Pa for 2 minutes. An aqueous HF solution is used as an enchant for the silicon oxide film 44, and the etching is performed at room temperature in a concentration of 10% for 1 minute. The oxide film 46 is formed such that oxygen gas ($O_2$) flows at a temperature of 900° C. and a flow rate of 10 l/min for 30 minutes.

Figure 1L:
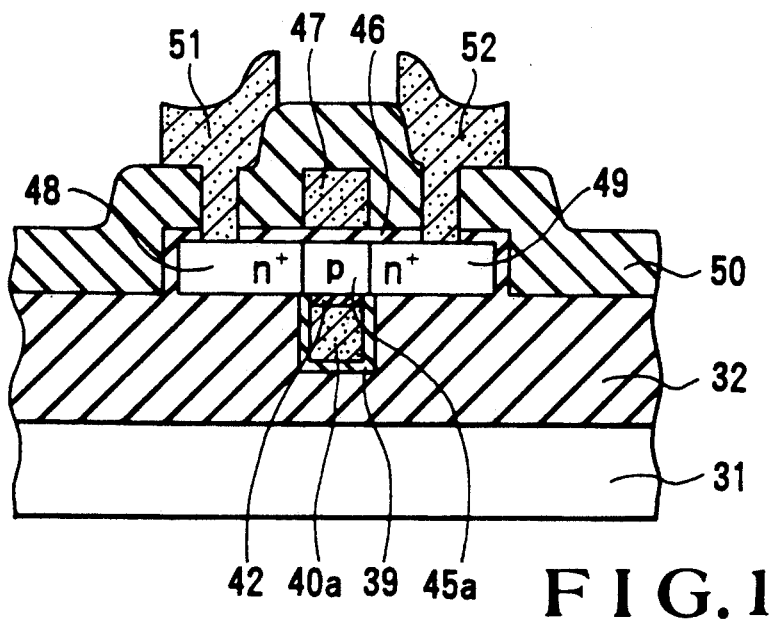
Figure 2:
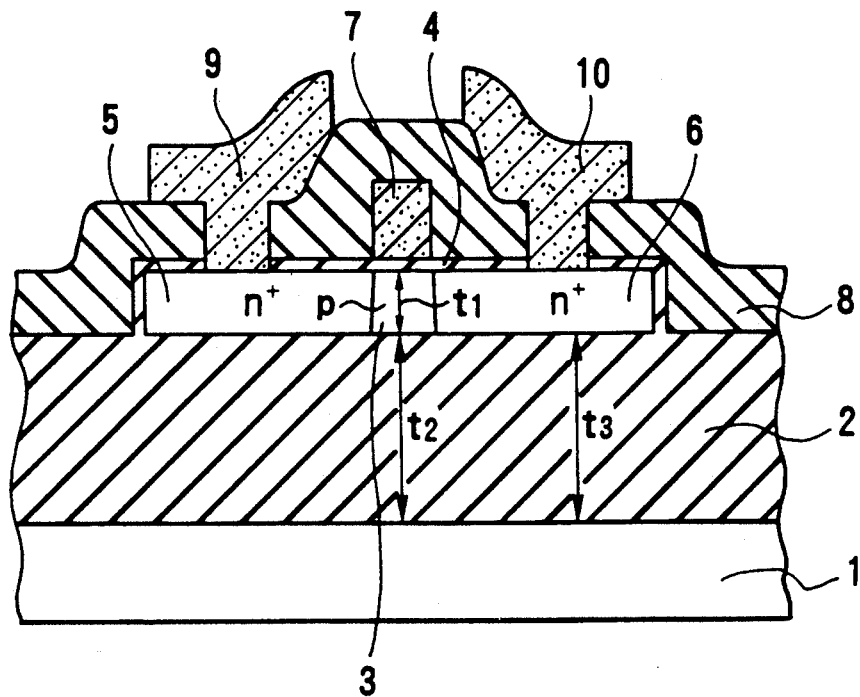
FIG. 2 is a sectional view showing the structure of a conventional SOI semiconductor element.
Figure 3:
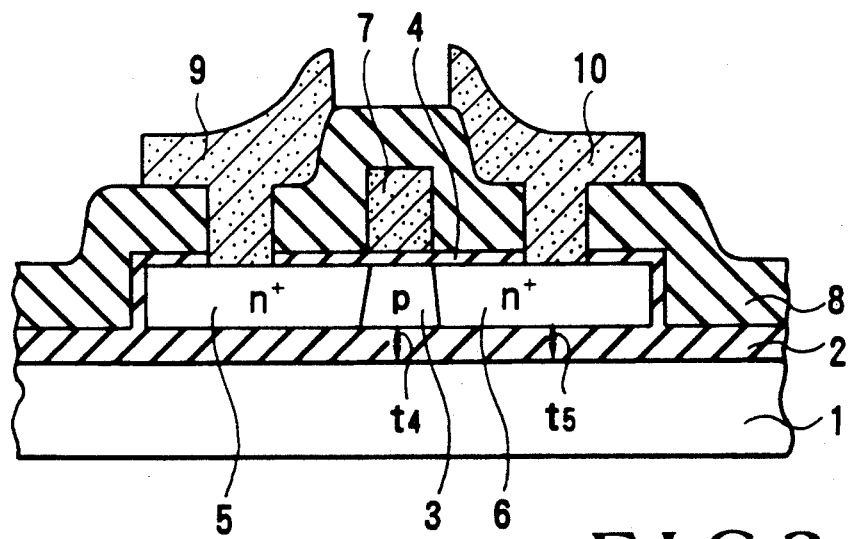
FIG. 3 is a sectional view showing the structure of another conventional SOI semiconductor element.
Figure 4:
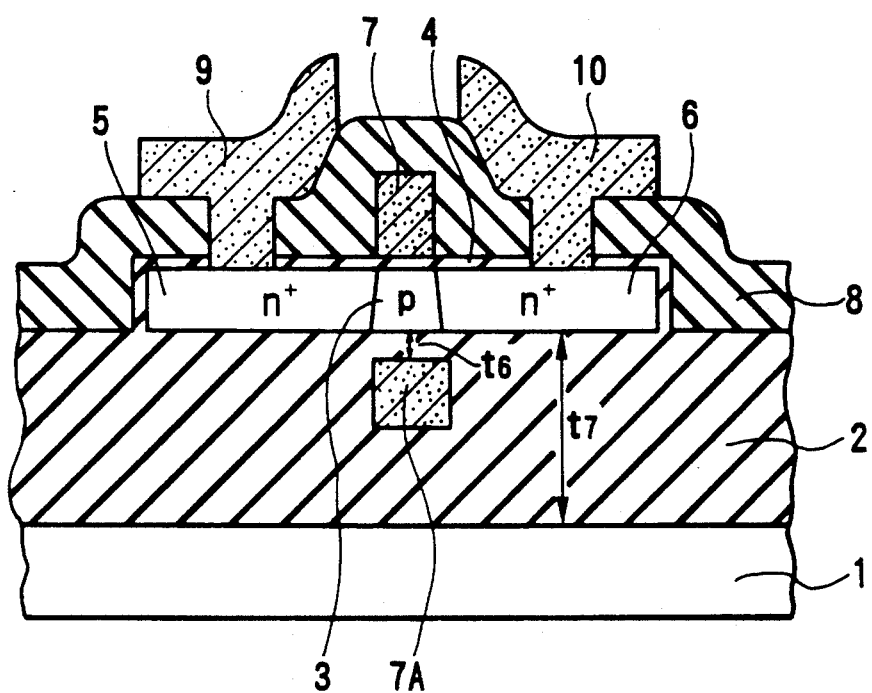
FIG. 4 is a sectional view showing the structure of an SOI semiconductor element proposed to solve problems of the SOI semiconductor elements shown in FIGS. 2 and 3.
Figure 5A:
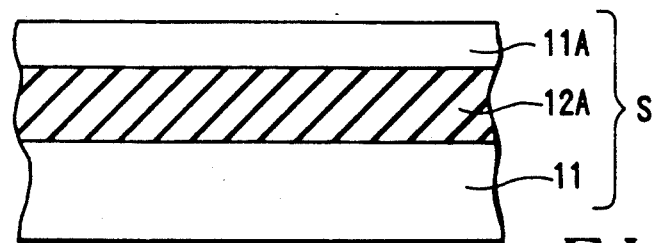
FIGS. 5A to 5E are sectional views showing the steps of a conventional method of manufacturing the SOI semiconductor element shown in FIG. 4.
Figure 5B:
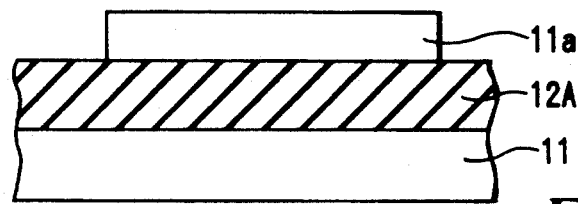
Figure 5C:
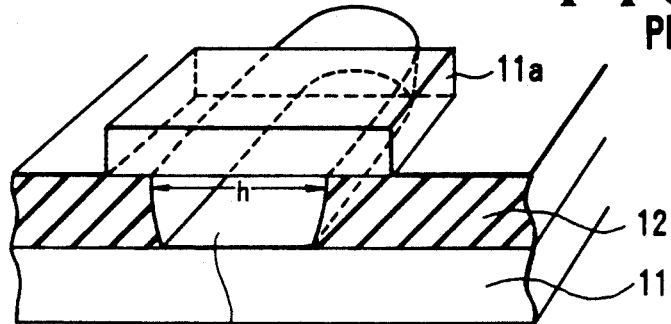
Figure 5D:
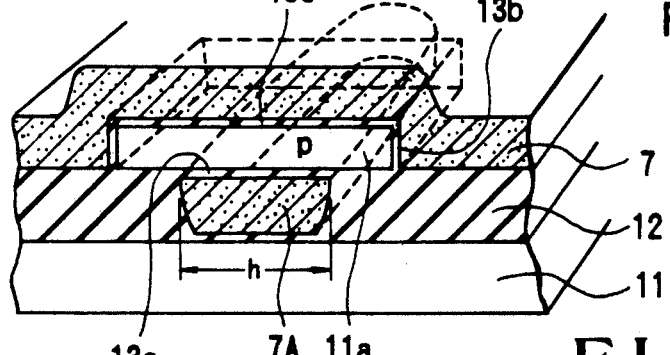
Figure 5E:
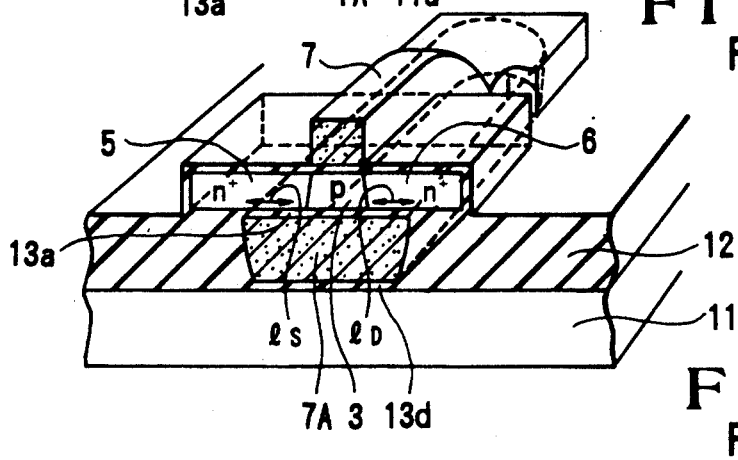
Figures 6A, 6B, 6C, 6D, 6E:
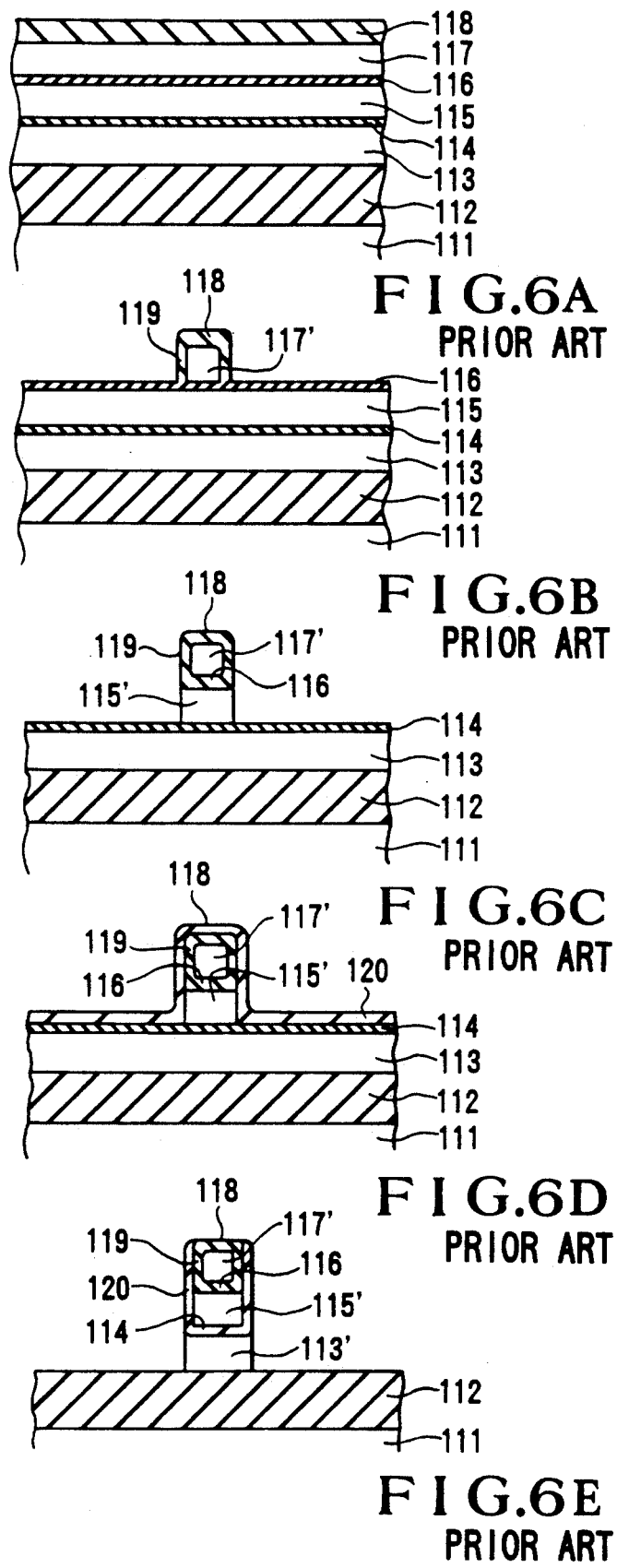
FIGS. 6A to 6H are sectional views showing the steps of another conventional method of manufacturing the conventional SOI semiconductor element shown in FIG. 4.
Figure 6F:
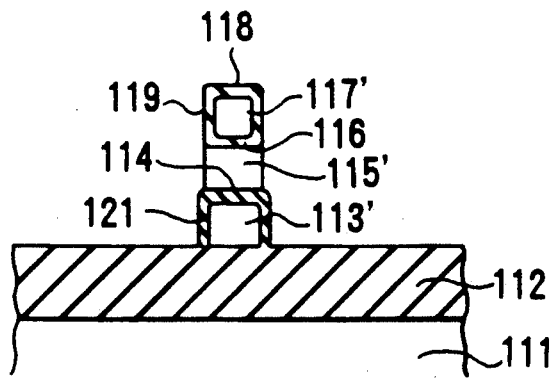
Figure 6G:
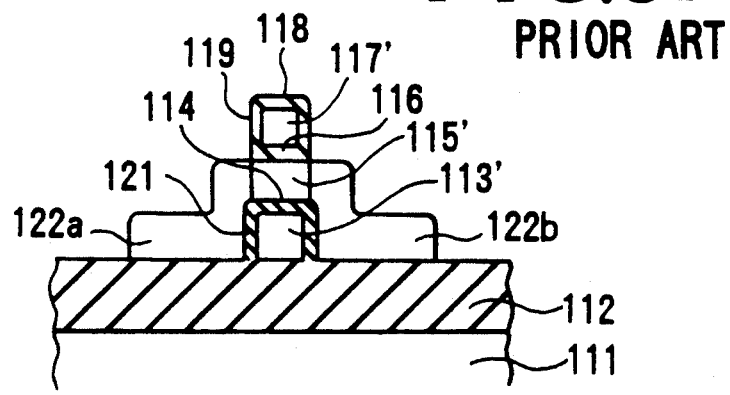
Figure 6H:
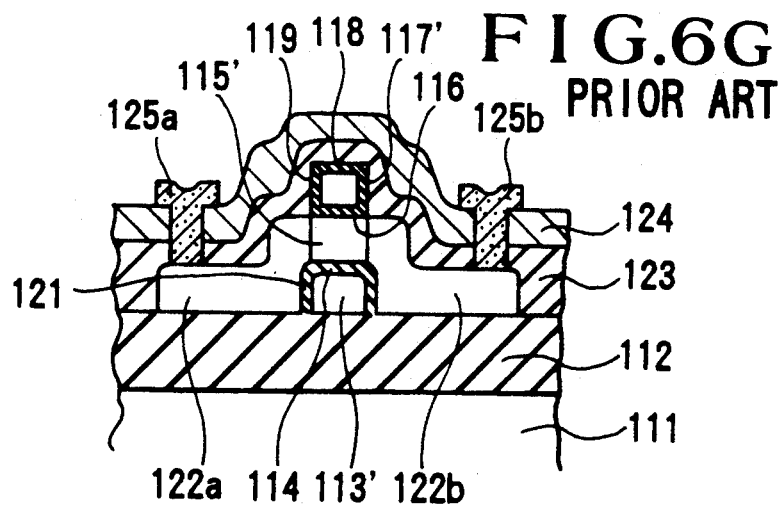

Finally, as shown in FIG. 1L, after a gate electrode 47 is formed, regions of a second conductivity type, e.g., n-type source and drain regions 48 and 49 are formed by an ion-implantation technique. Subsequently, after an insulator 50 is deposited, contact holes are formed, and a source electrode 51 and a drain electrode 52 are formed, thereby obtaining an SOI semiconductor element having the structure shown in FIG. 1L. Referring to FIG. 1L, reference number 45a denotes a p-type active layer formed between the source region 48 and the drain region 49.

According to the manufacturing method of this embodiment, since the silicon oxide film 42 immediately under the active layer 45a of the SOI semiconductor element can be formed as a buried film to have a small thickness, not only a short-channel effect can be sufficiently suppressed, but a buried oxide film 32a immediately under the drain and source regions 48 and 49 can be formed to have a sufficient thickness. For this reason, the parasitic capacitances of the drain and source regions of the SOI semiconductor element can be sufficiently decreased. In addition, since the dimensions of the silicon semiconductor layer 40a, i.e., a buried electrode 40a, can be freely controlled, the parasitic capacitance of the buried electrode can be suppressed to a minimum value, and large-scale integration and a high-speed operation can be realized at the same time.

In this embodiment, although a structure obtained by burying an insulator layer in a semiconductor substrate is used, a silicon monocrystalline substrate may be formed on an insulator layer. In this case, the following materials are used.

For example, a monocrystalline silicon substrate whose surface is polished to be flat is stacked on a quartz glass plate whose surface is polished to be flat. A pulse voltage of, e.g., 350 V is applied across the quartz plate and the monocrystalline silicon substrate at a pressure of 0.1 Pa and a temperature of 800° C. to 1,000° C. to bond them. Thereafter, the monocrystalline silicon substrate is polished to form a semiconductor substrate having a predetermined silicon film thickness.

In addition, an insulator layer and a monocrystalline semiconductor layer may be sequentially formed on the semiconductor substrate. In this case, the manufacturing steps will be described as follows.

For example, the surface of a first silicon semiconductor substrate whose surface is polished to be flat is oxidized to form a silicon oxide film having a predetermined thickness. A second monocrystalline silicon substrate whose surface is polished to be flat is stacked on the first silicon semiconductor substrate. A pulse voltage of, e.g., 350 V is applied across the first silicon semiconductor substrate and the second monocrystalline substrate at a pressure of 0.1 Pa and a temperature of 800° C. to 1,000° C. to bond them. Thereafter, the second monocrystalline silicon substrate is polished to form a semiconductor substrate having a predetermined silicon film thickness.

Furthermore, one surface of the substrate is oxidized, the oxidized portion may be used as a first insulator layer, and the semiconductor layer may be used as a first semiconductor layer. In this case, the manufacturing steps will be described as follows.

For example, the surface of a monocrystalline silicon semiconductor substrate whose surface is polished to be flat is oxidized to form a silicon oxide film having a predetermined thickness. Thereafter, the monocrystalline silicon substrate is polished to form a semiconductor substrate having a predetermined silicon film thickness.

As described above, according to the present invention, the following effects can be obtained.

(i) When an SOI semiconductor element is to be formed using a semiconductor substrate having a thick buried oxide film, since a relatively thin insulator is formed only immediately under an active layer of the SOI semiconductor element, a high-speed operation of the integrated circuit and down-scaling of the SOI semiconductor element can be achieved at the same time.

(ii) Since the length of a buried electrode can be freely controlled, overlapping between the buried electrode and a source/drain electrode can be prevented, and an increase in parasitic capacitance can be suppressed.

(iii) Since the depth at which the buried electrode is formed can be freely controlled, an increase in parasitic capacitance newly caused by the buried electrode can be suppressed.

(iv) In an SOI semiconductor element formed in the manufacturing method of the present invention, a parasitic capacitance caused by overlapping between the buried electrode and a source/drain region can be extremely suppressed, and the SOI semiconductor element can be operated at a speed higher than that of an SOI semiconductor element formed in a conventional manufacturing method.

What is claimed is:

1. A method of manufacturing an SOI semiconductor element, comprising the steps of:
   preparing a structure obtained by forming a first semiconductor layer on a first insulator;
   arranging a process mask on said first semiconductor layer, said process mask having a groove pattern of a predetermined size;
   forming a groove extending between said first semiconductor layer and said first insulator layer by etching said first semiconductor layer on the basis of the groove pattern of said process mask to expose said first insulator layer and etching said first insulator layer to a predetermined depth;
   forming a second semiconductor layer serving as a buried electrode in said groove such that a level of an upper surface of said second semiconductor layer is equal to a level of a bottom surface of said first semiconductor layer;
   forming a second insulator layer on said second semiconductor layer;
   performing crystalline growth of a semiconductor layer from side surfaces of said groove to bury the groove with a monocrystalline semiconductor;
   forming a source region and a drain region in said monocrystalline semiconductor buried in said groove; and
   forming a gate electrode on said monocrystalline semiconductor through a gate oxide film.

2. A method according to claim 1, wherein the step of preparing said structure comprises the step of burying an oxide layer in a semiconductor substrate to form said first insulator layer and said first semiconductor layer on said semiconductor substrate.

3. A method according to claim 1, wherein the step of preparing said structure comprises the step of forming a monocrystalline semiconductor layer on an oxide layer to form said first insulator layer and said semiconductor layer.

4. A method according to claim 1, wherein the step of preparing said structure comprises the step of forming a monocrystalline semiconductor layer on an oxide layer to form said first insulator layer and said first semiconductor layer.

5. A method according to claim 1, wherein the step of preparing said structure comprises the step of oxidizing one surface of a monocrystalline semiconductor layer to form said first insulator, while the rest of said monocrystalline semiconductor layer is used as said first semiconductor layer.

6. A method according to claim 1, wherein said first insulator layer is a silicon oxide film, and said first semiconductor layer is a silicon layer.

7. A method according to claim 6, further comprising:
   the step of sequentially forming a silicon oxide film layer and a silicon nitride film layer on said first semiconductor layer of said structure before the step of arranging said process mask; and
   after the step of forming said groove,
   the step of removing said process mask,
   the step of oxidizing a side wall of said first semiconductor layer exposed in said groove, and
   the step of forming a silicon nitride film in said groove.

8. A method of according to claim 7, wherein the step of forming said semiconductor layer as said buried electrode comprises the steps of:
   forming a second semiconductor layer consisting of a silicon semiconductor on a silicon nitride film including said groove; and
   etching said second semiconductor layer such that a level of an upper surface of said second semiconductor layer in said groove is set to be equal to a level of a lower surface of said first semiconductor layer.

9. A method according to claim 8, further comprising the steps of:
   removing said silicon nitride film exposed in said groove to expose an oxide film;
   removing said oxide film in said groove to expose said first semiconductor layer;

forming a silicon nitride film in said groove; and
removing said silicon nitride film from an upper surface of said second semiconductor layer to expose said second semiconductor layer;
wherein said second insulator layer is formed on said exposed second semiconductor layer.

10. A method according to claim 9, wherein the step of performing crystalline growth of a semiconductor layer from side surfaces of said groove to bury the groove with a monocrystalline semiconductor comprises the step of crystallizing said first semiconductor layer into a monocrystalline semiconductor layer.

* * * * *